US007858937B2

(12) United States Patent
Ogawa et al.

(10) Patent No.: US 7,858,937 B2
(45) Date of Patent: Dec. 28, 2010

(54) MASS SPECTROMETER

(75) Inventors: Kiyoshi Ogawa, Kizugawa (JP); Takeharu Etoh, Mino (JP)

(73) Assignees: Shimadzu Corporation, Kyoto (JP); Kinki University, Osaka (JP)

( * ) Notice: Subject to any disclaimer, the term of this patent is extended or adjusted under 35 U.S.C. 154(b) by 218 days.

(21) Appl. No.: 12/303,037

(22) PCT Filed: May 30, 2006

(86) PCT No.: PCT/JP2006/310775

§ 371 (c)(1), (2), (4) Date: Dec. 1, 2008

(87) PCT Pub. No.: WO2007/138679

PCT Pub. Date: Dec. 6, 2007

(65) Prior Publication Data

US 2009/0272890 A1 Nov. 5, 2009

(51) Int. Cl.
*H01J 37/252* (2006.01)

(52) U.S. Cl. ....................... 250/309; 250/299; 250/283; 250/281

(58) Field of Classification Search ................. 250/309, 250/299, 283, 281
See application file for complete search history.

(56) References Cited

U.S. PATENT DOCUMENTS 3,819,941 A * 6/1974 Carrico ....................... 250/281

(Continued)

FOREIGN PATENT DOCUMENTS

JP 2000-231901 A 8/2000

(Continued)

OTHER PUBLICATIONS

Y. Naito, "Mass Microprobe Aimed at Biological Samples," J. Mass Spectrom. Soc. Jpn., 2005, pp. 125-132, vol. 53, No. 3.

(Continued)

*Primary Examiner*—Kiet T Nguyen
(74) *Attorney, Agent, or Firm*—Sughrue Mion, PLLC

(57) ABSTRACT

A sample S is irradiated with a two-dimensionally spread ray of laser light to simultaneously ionize substances within a two-dimensional area on the sample. The resultant ions are mass-separated by a TOF mass separator 4 without changing the interrelationship of the emission points of the ions. The separated ions are then directed to a two-dimensional detector section 7 through a deflection electric field created by deflection electrodes 61 and 62. The two-dimensional detector section 7 consists of a plurality of detection units 7*a* arranged in parallel, each unit including an MCP 8*a*, fluorescent plate 9*a* and two-dimensional array detector 10*a*. The magnitude of deflecting the flight path of the ions by the deflection electric field is changed in a stepwise manner with the lapse of time from the generation of the ions so that a plurality of mass analysis images are sequentially projected on each detection unit 7. When the mass analysis image shifts from one detection unit to another, the data acquisition operation by the two-dimensional array detector in the previous detection unit is discontinued. As a result, a predetermined number of the latest images are held inside the detector. Thus, the measurement time can be extended to widen the measurable mass-to-charge ratio range, while ensuring a high mass resolution.

7 Claims, 9 Drawing Sheets

U.S. PATENT DOCUMENTS

| | | | | |
|---|---|---|---|---|
| 4,785,172 | A * | 11/1988 | Kubena et al. | 850/9 |
| 7,550,722 | B2 * | 6/2009 | Scheidemann et al. | 250/299 |

FOREIGN PATENT DOCUMENTS

| | | | |
|---|---|---|---|
| JP | 2001-345411 | A | 12/2001 |
| JP | 2001-345441 | A | 12/2001 |
| JP | 2002-116184 | A | 4/2002 |
| JP | 2002-367558 | A | 12/2002 |
| JP | 2004-235621 | A | 8/2004 |
| JP | 2004-281269 | A | 10/2004 |
| JP | 2006-511912 | A | 4/2006 |
| JP | 2007-242252 | A | 9/2007 |
| WO | 01/73849 | A1 | 10/2001 |
| WO | 2004/059693 | A2 | 7/2004 |
| WO | 2004/061965 | A1 | 7/2004 |

OTHER PUBLICATIONS

K. Ogawa, et al., “Research and Development of Mass Microscope,” Shimadzu Review, 2006, pp. 125-135, vol. 62, No. 3-4.

M. El Rahim, et al., “Position sensitive detection coupled to high-resolution time-of-flight mass spectrometry: Imaging for molecular beam deflection experiments,” Review of Scientific Instruments, 2004, pp. 5221-5227, vol. 75, No. 12.

* cited by examiner

MASS SPECTROMETER

TECHNICAL FIELD

The present invention relates to a mass spectrometer for ionizing one or more substances present within a two-dimensional area on a sample, and then performing a mass analysis of the ionized substances. The mass spectrometer according to the present invention is particularly suitable for a mass microscope, which is the combination of a microscope for microscopically observing a two-dimensional area on a sample and a mass spectrometer for performing a mass analysis of the substances present on the observed area to obtain two-dimensional information concerning their qualities and/or quantities.

BACKGROUND ART

Mass spectrometers are an apparatus for ionizing molecules and atoms of a component included in a gaseous, liquid or solid sample and separating the ions according to their mass-to-charge ratio to detect them in order to identify the component or determine its content. These days, it is widely used for various purposes such as the determination of biological samples or analysis of proteins or peptides.

In the fields of biochemistry and medicine, which treat living organisms, there is a great demand for obtaining the distribution information of proteins included in a cell in vivo without destroying the cell. In order to meet such a demand, a mass microscope having both the function of a microscope and that of a mass spectrometer has been developed in many places. A mass microscope makes it possible to obtain information about the distribution or other properties of a substance in a two-dimensional area on a sample set on a preparation or the like. This type of mass analysis conventionally requires repeating the operations of two-dimensionally scanning the irradiation point of an ionization laser beam or particle beam on the sample, collecting the ions generated from the irradiation point every time the irradiation point is shifted, mass-separating the ions and eventually detecting the separated ions. Repeating such operations requires a considerably long period of time if the mass analysis needs to be performed over a two-dimensional region with a certain area. This situation is undesirable not only because the analysis time becomes long, but because the biological sample may be damaged or degraded during the long period of time, causing the analysis to be rather inaccurate.

To address this problem, a method has been proposed in Non-Patent Document 1. According to this method, ions are two-dimensionally generated so that they reflect the two-dimensional distribution of the substances on a sample. The resultant ions are then mass-separated by a time-of-flight (TOF) mass separator and detected by a two-dimensional detector. Unfortunately, this method is costly since arranging a plurality of conventional ion detectors in a two-dimensional pattern requires providing as many measurement circuits (amplifiers, digitizers and so on) in parallel. On the other hand, decreasing the number of ion detectors for cost reduction deteriorates the positional (or spatial) resolution of the system, making the method rather impractical.

As a means for overcoming such problems, the inventors have proposed a novel mass microscope in Japanese Patent Application No. 2006-58816. The new mass microscope employs an image sensor having a special construction, called the in-situ storage image sensor, as the two-dimensional array detector. In this mass microscope, ions are mass-separated by a TOF mass separator or similar device and then directed to a micro channel plate (MCP), which emits electrons by an amount larger than that of the incident ions. Those electrons are converted into light by a fluorescent plate, and this light is further converted into an electric signal by the in-situ storage image sensor. Thus, an electric signal corresponding to the amount of the original ions is extracted.

Detailed information concerning the in-situ storage image sensor is available in the existing literature, such as Patent Document 1 or 2. Accordingly, no detailed description is hereby provided. Briefly, an in-situ storage image sensor includes storage charge-coupled devices (CCDs), each of which is coupled with a photodiode used as a light-receiving element and is capable of storing and transferring signals for a predetermined number of records (or frames). During an image-capturing process, the pixel signals generated by photoelectric conversion at the photodiode are sequentially transferred to the storage CCD. After the image-capturing process is completed, the pixel signals corresponding to the predetermined number of recorded images, which have been stored in the storage CCD, are collectively read out from the sensor to externally reproduce the predetermined number of images. Pixel signals that have exceeded the predetermined number of records during the image-capturing process are chronologically discarded from the oldest one. Thus, a predetermined number of the latest pixel signals are constantly held in the storage CCD. When the transfer of pixel signals to the storage CCD is discontinued at the end of the image-capturing process, the latest set of images from the newest image back through the predetermined number of images can be retrospectively obtained. Thus, as compared with normal image sensors that require extracting image signals corresponding to one frame every time those image signals are obtained, the in-situ storage image sensor is characterized in that it can repeatedly capture images at extremely high rates.

Although this type of two-dimensional array detector can acquire images at extremely high rates, the number of images that can be acquired is structurally limited. For example, if a detector capable of acquiring 100 frames of images at a rate of one million frames per second is used, it is possible to obtain mass analysis data over a time range of 100 μsec at intervals of 1 μsec. If a detector capable of acquiring 100 frames of images at a higher rate of ten million frames per second is used, it is possible to obtain mass analysis data over a time range of 10 μsec at intervals of 100 nsec. In any case, the number of mass analysis data is limited by the number of frames that the two-dimensional array detector can successively acquire.

In a TOF mass separator, the mass-to-charge ratio difference is represented as a difference in the flight time. Therefore, in order to improve the mass resolution, the time interval at which the acquisition of mass analysis data is repeated should preferably be as short as possible. Meanwhile, the range of the mass-to-charge ratios that can be measured by one analysis operation should preferably be as wide as possible. For that purpose, the acquisition of mass analysis data must be repeated as many times as possible.

For example, if an ion with a mass-to-charge ratio of 1000 [amu] is given 10 [keV] of energy and made to fly straight for a distance of 2 [m], its flight time will be approximately 45.69 μsec, whereas the flight time of an ion with a mass-to-charge ratio of 1010 [amu] under the same conditions will be approximately 45.92 μsec. The flight-time difference between these two ions is approximately 0.23 μsec. This example demonstrates that the mass-to-charge ratio difference of 10 [amu] is detectable if the mass analysis data can be repeatedly acquired at intervals of 0.2 μsec. Under the present conditions, using a sensor capable of acquiring 100 frames of images enables the mass analysis data to be repeatedly collected for 0.2×100=20 μsec. For example, if the acquisition of mass analysis data is initiated at a point in time (t1) where 45 μsec have elapsed since an emission of ions, the data acquisition can be continued until the point in time (t2) where the lapse of time from the emission of ions reaches 65 μsec. Meanwhile, the flight time of an ion with a mass-to-charge ratio of 2000 [amu] is approximately 64.61 μsec. Thus, the mass-to-charge ratios that can be measured by the data acquisition over the time range from t1 to t2 are limited to the range of 1000 to 2000 [amu].

The flight time of an ion with a mass-to-charge ratio of 10000 [amu] is 144.47 μsec. Accordingly, the difference in the flight time between 1000 [amu] and 10000 [amu] is 100 μsec. Measuring this flight-time range with a two-dimensional array detector capable of simultaneously acquiring 1000 frames results in 1 μsec of time difference per frame (i.e. the time resolution). As stated previously, the flight time of an ion with 1000 [amu] is approximately 45.69 μsec; therefore, the point in time later than that by the time resolution 1 μsec is 46.69 μsec. Detected at this point in time is an ion with a mass-to-charge ratio of 1044 [amu]. Accordingly, the mass resolution of this mass spectrometer is no shorter than approximately 44 [amu].

Thus, the conventional mass microscope has the problem that increasing the mass resolution narrows the mass-to-charge ratio range that can be covered by one measurement, whereas widening the mass-to-charge ratio range lowers the mass resolution. It is theoretically possible to simultaneously achieve both a wider mass-to-charge ratio range and higher mass resolution by using a two-dimensional array detector capable of acquiring a larger number of frames. However, for that purpose it is necessary to increase the area of the storage CCD mounted on the device, which will correspondingly reduce the area of the photodiode and deteriorate the sensitivity or spatial resolution of the detector.

Patent Document 1: Japanese Unexamined Patent Application Publication No. 2001-345411

Patent Document 2: Japanese Unexamined Patent Application Publication No. 2004-235621

Non-Patent Document 1: Yasuhide NAITO, "Seitai Shiryou Wo Taishou Ni Shita Shitsuryou Kenbikyou (Mass Microscope for Bio-samples)", *J. Mass Spectrom.*, Soc. Jpn., Vol. 53, No. 3, 2005

DISCLOSURE OF THE INVENTION

Problem to be Solved by the Invention

The present invention has been developed to solve the aforementioned problems. In the field of a mass spectrometer designed for the mass analysis of a two-dimensional area on a sample using an in-situ storage image sensor or similar high-speed image sensor as the two-dimensional array detector, the objective of the present invention is to provide a mass spectrometer capable of widening the mass-to-charge ratio range that can be covered by one measurement while ensuring a high mass resolution.

Means for Solving the Problems

To solve the aforementioned problems, the present invention provides a mass spectrometer, including:

a) an ionizer for simultaneously ionizing components present within a predetermined two-dimensional area on a sample;

b) a mass separator for separating ions, generated by the ionizer, in such a manner that the ions will be emitted at different points in time according to their mass-to-charge ratio while maintaining the two-dimensional relative positional relationship with which the ions have been generated;

c) a two-dimensional detector including multiple pairs of converters and two-dimensional array detectors, each converter receiving the ions separated by the mass separator and converting each ion into a photon or electron whose amount corresponds to that of the ion, while maintaining the two-dimensional relative positional relationship with which the ions have been generated, each two-dimensional array detector consisting of an in-situ storage image sensor having a detector section and a memory section, the detector section including two-dimensionally arrayed micro detection elements each detecting the photon or electron produced by the converter and outputting a corresponding electric signal, the memory section being capable of individually holding electric signals produced by each micro detection element for a predetermined number of frames, the multiple pairs of converters and two-dimensional array detectors being arranged in parallel along the extending direction of the detector section; and d) an ion deflector located in a space between an ion emission port of the mass separator and the converters, for creating an electric field and/or magnetic field producing a force for deflecting the flight path of an ion passing through the space, wherein the magnitude of deflecting the flight path with the ion deflector is changed so that an ion passing through the ion deflector at a different point in time will be detected by a different pair of the converter and the two-dimensional array detector in the two-dimensional detector.

The two-dimensional array detector in the present invention is either a normal type in-situ storage image sensor having the detector section formed by the two-dimensionally arrayed micro detection elements performing photoelectric conversion, or a reverse-side type in-situ storage image sensor in which each micro detection element captures and detects an electron impinging on a detection surface located on the side opposite to the side where the detector section is formed. (The "opposite" side is normally the reverse side of the substrate). In any case, the two-dimensionally arrayed micro detection elements are each provided with a memory section such as a storage CCD capable of storing and transferring signals for N frames (where N is an integer greater than one). During an image-capturing process, the electric signals generated by the micro detection element are sequentially transferred to the memory section. After the image-capturing process is completed, the electric signals stored in the memory section are collectively read out. Thus, pixel signals for N frames can be acquired simultaneously (i.e. not sequentially or frame by frame). Electric signals that have exceeded the N frames during the image-capturing process are chronologically discarded from the oldest one. Consequently, electric signals corresponding to the latest N frames are constantly held in the memory section. Therefore, when the transfer of electric signals to the memory section is discontinued at the end of the image-capturing process for example, the latest N frames of images from the newest image back through the N frames can be retrospectively obtained.

In the mass spectrometer according to the present invention, the two-dimensional array detector having the aforementioned configuration is paired with a converter, and a plurality of such pairs are provided in parallel. Each two-dimensional array detector can internally hold image signals for N frames, and the transfer of new electric signals to the memory section can be discontinued at any point in time. Therefore, it is possible to acquire, at high rates, N frames of images corresponding to a different time range. The mass separator performs mass separation so that ions having different mass-to-charge ratios are individually emitted from the emission port at different points in time. The ion deflector bends the flight path so that the ions having different mass-to-charge-ratios, which originated from the same point on the sample, are each directed to the converter of a different pair and detected by the two-dimensional array detector for that converter.

The mass spectrometer may further include a controller for controlling the operation of storing electric signals in the memory section in each two-dimensional array detector, wherein the controller controls each of the multiple two-dimensional array detectors so that the aforementioned operation will be synchronized with the timing at which an ion reaches the converter for the two-dimensional array detector concerned. In this case, a two-dimensional substance distribution image ("mass analysis image") corresponding to a different mass-to-charge ratio range can be acquired at the two-dimensional array detector of a different pair. Additionally, the mass spectrometer may be designed so that the number of pairs of the converters and two-dimensional array detectors can be increased and the magnitude of deflecting the flight path with the ion deflector can be accordingly increased. This design makes it possible to expand the total range of the measurable mass-to-charge ratios even if each pair of the converter and two-dimensional array detector has a narrow measurable range. The mass resolution depends on the time intervals at which the electric signals are transferred to the memory section in each two-dimensional array detector.

To perform the previously described mass separation, a time-of-flight (TOF) mass analyzer can typically be used as the mass separator. By this configuration, various ions that have been simultaneously generated from a sample by a short-time laser irradiation can be temporally separated and then detected according to their mass-to-charge ratio without wasting any ions, so that a high level of detection sensitivity is achieved.

In a mode of the mass spectrometer according to the present invention, the ion deflector includes one or more pairs of deflection electrodes facing one another across the space which the ions pass through and a voltage applier for applying a voltage to the deflection electrodes, and the voltage can be changed so as to change the magnitude of deflection of the flight path of the ions.

This configuration enables the magnitude of deflection of the flight path to be arbitrarily controlled by changing the voltage applied to the deflection electrodes. Therefore, where to project the mass analysis image can be freely determined. For example, a different magnitude of deflection can be set for each mass-to-charge ratio range so that each of the plural converters will receive ions included in a different mass-to-charge ratio range, or so that the incident point of ions will gradually move across the plural converters as the mass-to-charge ratio increases. Furthermore, this configuration is easy to adapt to a change in the size of the ion-receiving surface of the converter or other variations.

In another mode of the mass spectrometer according to the present invention, the ion deflector includes a pair of magnetic poles facing each other across the space which the ions pass through, wherein the magnitude of deflection of the flight path changes with a change in the mass-to-charge ratio of ions passing through a constant magnetic field created by the magnetic poles.

An ion passing through the magnetic field experiences a force from the magnetic field and deflects by a magnitude corresponding to its mass-to-charge ratio. Although the force of the magnetic field is constant, the magnitude of deflection of the flight path increases as the mass-to-charge ratio of the ions decreases. Thus, a shift of the projected mass analysis image changes is achieved.

Effect of the Invention

In a mass spectrometer using a two-dimensional array detector consisting of an in-situ storage image sensor or similar detector capable of repeatedly acquiring images at high rates yet for only a limited number of frames, the present invention makes it possible to acquire, by one measurement, two-dimensional distribution information (or mass analysis images) of a substance with a high mass resolution and over a wide range of mass-to-charge ratios.

BEST MODES FOR CARRYING OUT THE INVENTION

First Embodiment

Figure 1:
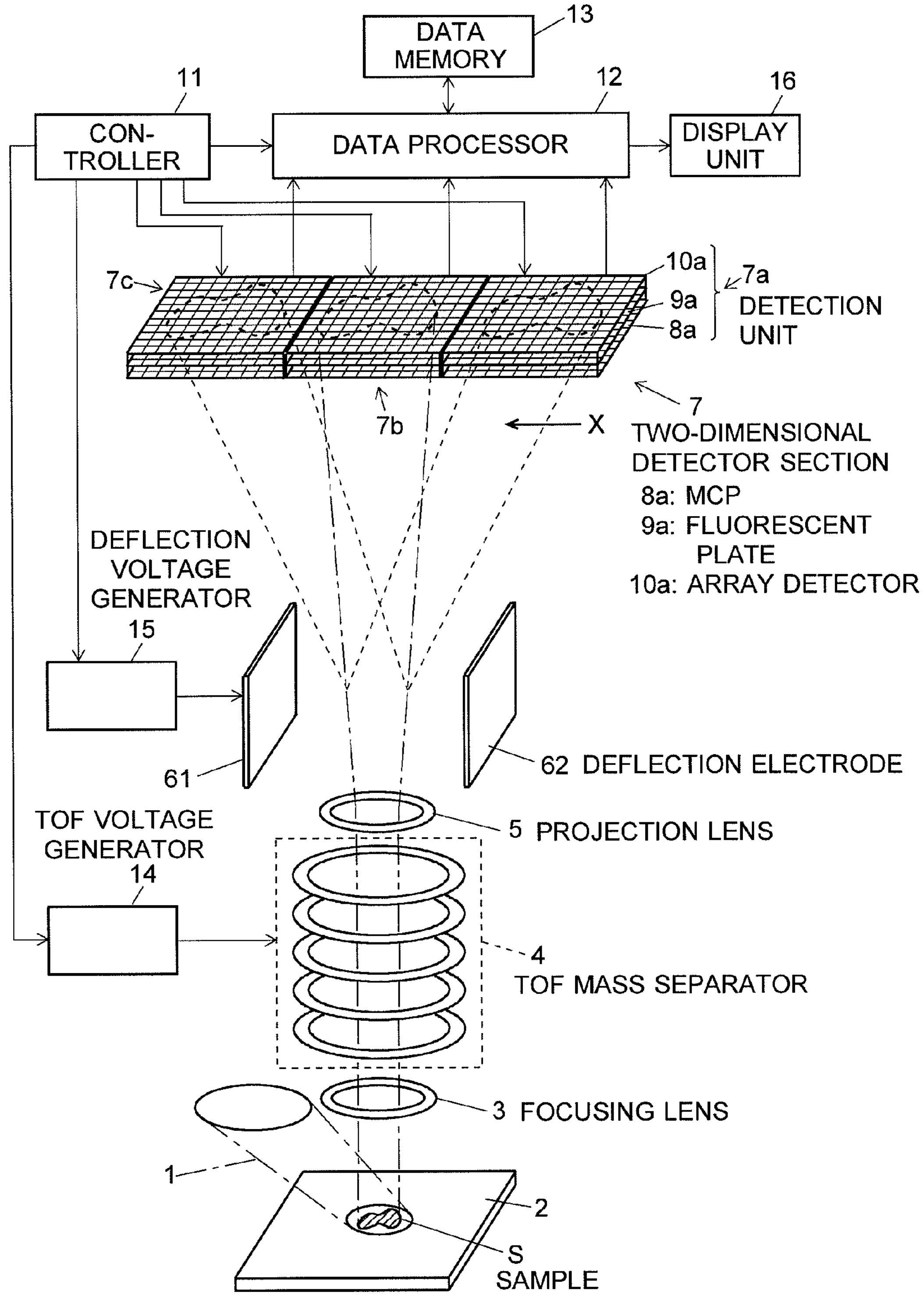
FIG. 1 is a configuration diagram of the essential portions of a mass microscope according to one embodiment (first embodiment) of the present invention.

A mass microscope, which is one (first) embodiment of the mass spectrometer according to the present invention, is hereinafter described with reference to the drawings. FIG. 1 is a configuration diagram of the essential portions of the mass microscope in the first embodiment.

This mass microscope employs a laser desorption ionization (LDI) method in order to simultaneously ionize all the components contained in a sample. In this method, a sample S placed on a sample stage 2 is irradiated for a short period of time with a two-dimensionally spread ray of ionization laser light 1. The irradiation of the sample S with the laser light 1 causes various substances present within a two-dimensional area on the sample to be almost simultaneously ionized. Thus, various ions are generated in a two-dimensionally distributed form. These ions are then introduced through a focusing lens 3 into a time-of-flight (TOF) mass separator 4 while maintaining the relative positional relationship of the sample portions at which they have been generated. The TOF mass separator 4 in this embodiment is a linear TOF, which may be replaced by another type of TOF, such as a reflectron or multi-turn type. The important point is that the ions emitted from different portions on the sample S will never be mixed together during the mass separation process; the ions should maintain their relative positional relationship with which they have been emitted from the sample S.

While flying through the flight space within the TOF mass separator 4, the ions are separated along the traveling direction according to their mass-to-charge ratio. Specifically, the ions that have been emitted from the same point on the sample S with different mass-to-charge ratios fly along the same path; while passing through the flight space of the TOF mass separator 4, ions with smaller mass-to-charge ratios fly ahead, whereas ions with larger mass-to-charge ratios becomes more delayed. The ions that have been thus temporally separated then exit the TOF mass separator 4, fly through a projection lens 5 and pass through the space between two deflection electrodes 61 and 62 facing each other. Located in the traveling direction of these ions is a two-dimensional detector section 7.

The two-dimensional detector section 7 consists of three detection units 7*a*, 7*b* and 7*c* arrayed side by side along the X-axis. The detection unit 7*a* includes a. micro channel plate (MCP) 8*a*, fluorescent plate 9*a* and two-dimensional array detector 10*a*. The other two detection units 7*b* and 7*c* also have the same structure.

Figure 5:
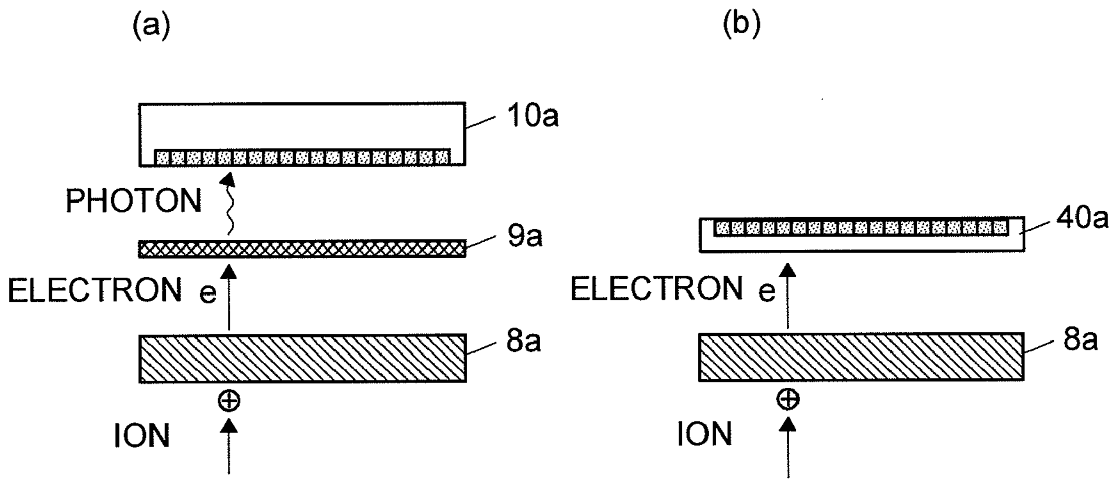
FIG. 5 is a schematic sectional view showing the configuration of a detection unit using either (a) a normal type in-situ storage image sensor or (b) reverse-side type in-situ storage image sensor.

FIG. 5(*a*) is a schematic sectional view showing the ion-detecting operation of one detection unit 7*a*. The MCP 8*a* receives two-dimensionally distributed ions, converts each ion into electrons and multiplies them. The fluorescent plate 9*a* receives the electrons multiplied by the MCP 8*a* and converts them into photons. These photons then reach the detection surface of the two-dimensional array detector 10*a*. The MCP 8*a* and fluorescent plate 9*a* each maintain the two-dimensional relative positional relationship of the incident ions. Therefore, the relative positional relationship of the portions on the sample S at which the ions have been emitted is also maintained on the detection surface of the two-dimensional array detector 10*a*. (However, the two-dimensional image may possibly be enlarged or reduced in its entirety since the absolute positional relationship, i.e. the size, is not maintained.)

Figure 2:
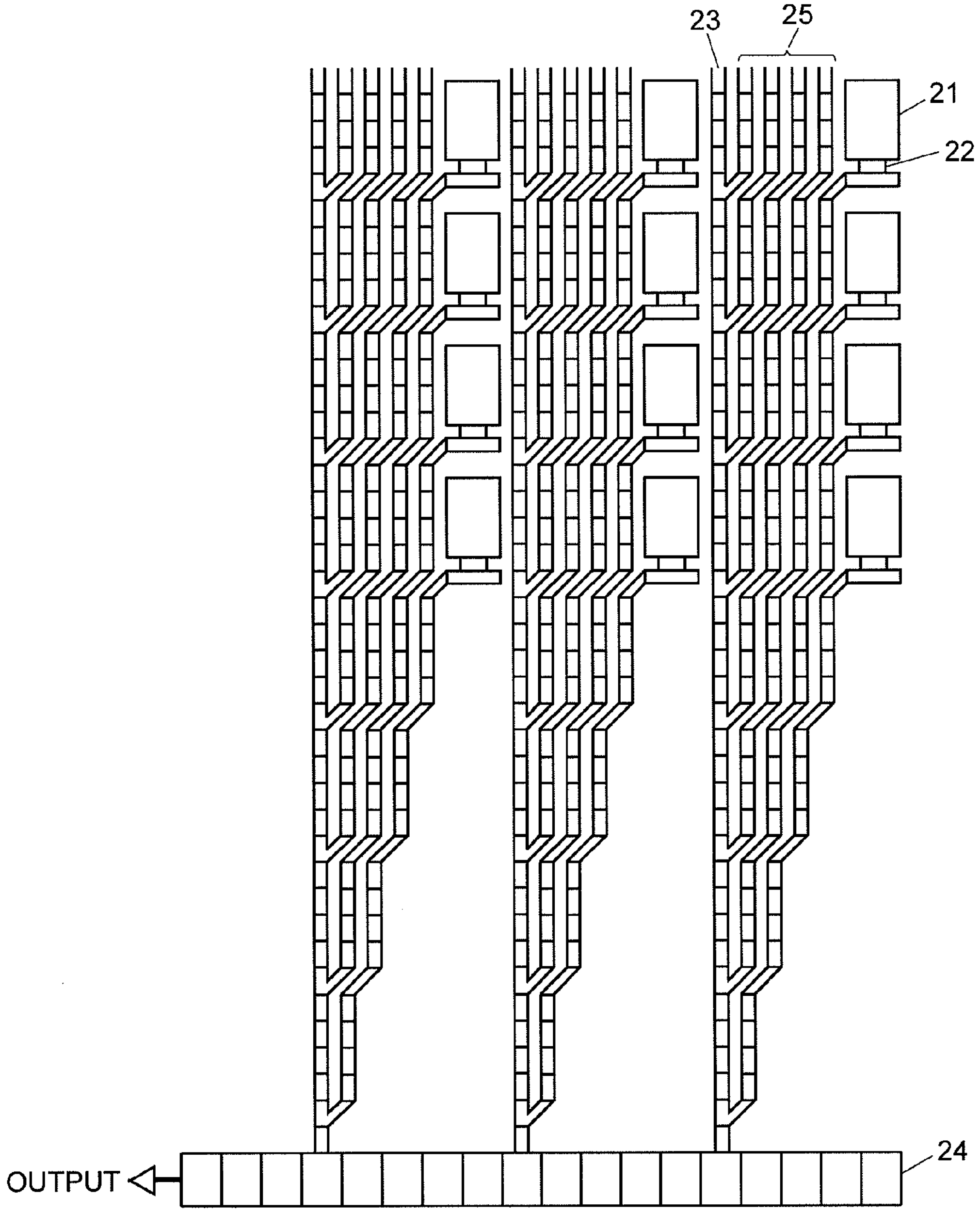
FIG. 2 is a schematic configuration diagram of an in-situ storage image sensor used in the mass microscope of the first embodiment.
Figure 3:
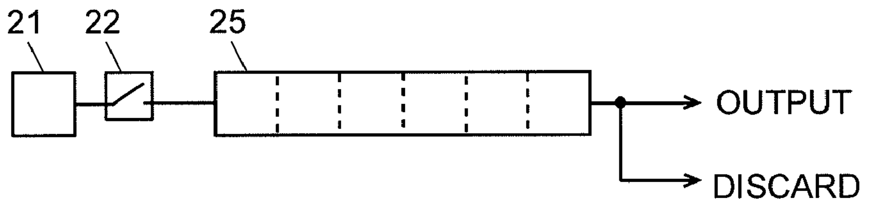
FIG. 3 is a functional configuration diagram of one pixel of the in-situ storage image sensor shown in FIG. 2.

As stated earlier, the two-dimensional array detector 10*a* is an image sensor having a structure called the in-situ storage image sensor. FIG. 2 is a diagram schematically showing the structure of this image sensor. FIG. 3 is a functional configuration diagram of one pixel of the image sensor shown in FIG. 2.

As shown in FIG. 2, there are a large number of photodiodes 21 (i.e. micro detection elements for photoelectric conversion) two-dimensionally arrayed on the detection surface. Provided within or around each pixel are the storage CCD lines 25, which function as the memory section for holding and sequentially transferring signal charges generated by each photodiode 21. The signal charges generated by the photodiode 21 are conveyed through a writing gate 22 into a corresponding storage CCD line 25. Each of the storage CCD lines 25 has one end connected to one of a plurality of vertically aligned photodiodes 21 and the other end connected to a shared vertical charge transfer section 23. There are a plurality of vertical charge transfer sections 23 horizontally aligned, with their ends being connected to a shared horizontal charge transfer section 24. The storage CCD line 25 can hold detection signals (or pixel signals if each photodiode 21 is regarded as one pixel) for a predetermined number of frames. Therefore, it is possible to continuously acquire pixel signals for the predetermined number of frames at high rates without intermediately reading out the detection signals. After the signal acquisition is completed, the pixel signals that have been held can be read out and processed by an external system.

The timing for transferring signal charges to the storage CCD lines 25, the readout of signal charges from the storage CCD lines 25 and other operations in the two-dimensional array detector 10*a* are controlled by a controller 11, which will be described later. The other two-dimensional array detectors 10*b* and 10*c* are also similarly controlled. The signals read out from each of the two-dimensional array detectors 10*a*, 10*b* and 10*c* are all sent to a data processor 12 and temporarily stored in a data memory 13. The data processor 12 appropriately reads out data from the data memory 13, carries out predetermined analysis processes on the data, and displays the analysis result on the screen of a display unit 16.

The controller 11, which includes a central processing unit (CPU) and other components, controls the operations of the two-dimensional array detectors 10*a*, 10*b* and 10*c*. It also controls a TOF voltage generator 14, which controls the flight of the ions within the TOF mass separator 4, and a deflection voltage generator 15, which applies a deflection voltage to the deflection electrodes 61 and 62.

An example of the measurement using the mass microscope having the aforementioned configuration is hereinafter described. The controller 11 controls the deflection voltage generator 15 so that the deflection voltage applied to one deflection electrode 61 changes with the lapse of time from the laser irradiation in a stepwise manner, i.e. in the three stages of −Va, zero and Va, as indicated by the solid line in FIG. 4(*a*), while the deflection voltage applied to the other deflection electrode 62 changes in the opposite order of Va, zero and −Va as indicated by the dashed line in FIG. 4(*a*). A short-time irradiation with the laser light 1 causes various ions to be almost simultaneously generated within a two-dimensional area of the sample S. Then, these ions are introduced through the focusing lens 3 into the TOF mass separator 4, as explained earlier. While passing through the flight space of the TOF mass separator 4, ions with smaller mass-to-charge ratios fly ahead, whereas ions with larger mass-to-charge ratios become more delayed. Accordingly, among the various ions that have been generated, an ion having the smallest mass-to-charge ratio will be the first to arrive at the space between the deflection electrodes 61 and 62. Subsequently, the mass-to-charge ratio of the arriving ions gradually increases with time.

Figure 4:
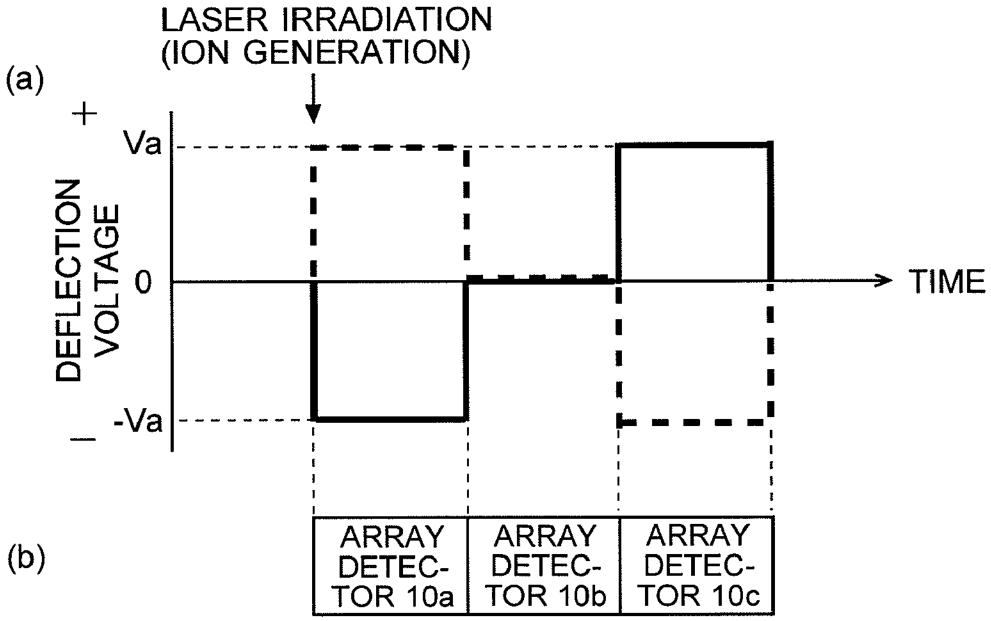
FIG. 4 is a waveform chart showing a voltage applied to the deflection electrodes in the mass microscope of the first embodiment.

As shown in FIG. 4(*a*), a negative deflection voltage −Va and positive deflection voltage +Va are respectively applied to the deflection electrodes 61 and 62 in the initial stage of the measurement. These voltages create a negative deflection electric field. Due to this field, ions having relatively small mass-to-charge ratios, which initially pass through the field, are made to considerably deflect in the negative direction of the X-axis in FIG. 1 (to the right in FIG. 1). These ions are then directed to the MCP 8*a* of the detection unit 7*a*. Accordingly, while the deflection voltage −Va is applied to the deflection electrode 61 and the deflection voltage +Va to the deflection electrode 62, the detection unit 7*a* practically the only unit that detects the ions; no ion comes to the other detection units 7*b* and 7*c*. At this point, the controller 11 sends control signals to the detection units 7*a*, 7*b* and 7*c* so that they sequentially forward signal charges to the storage CCD lines 25 at predetermined intervals of time.

Figure 7:
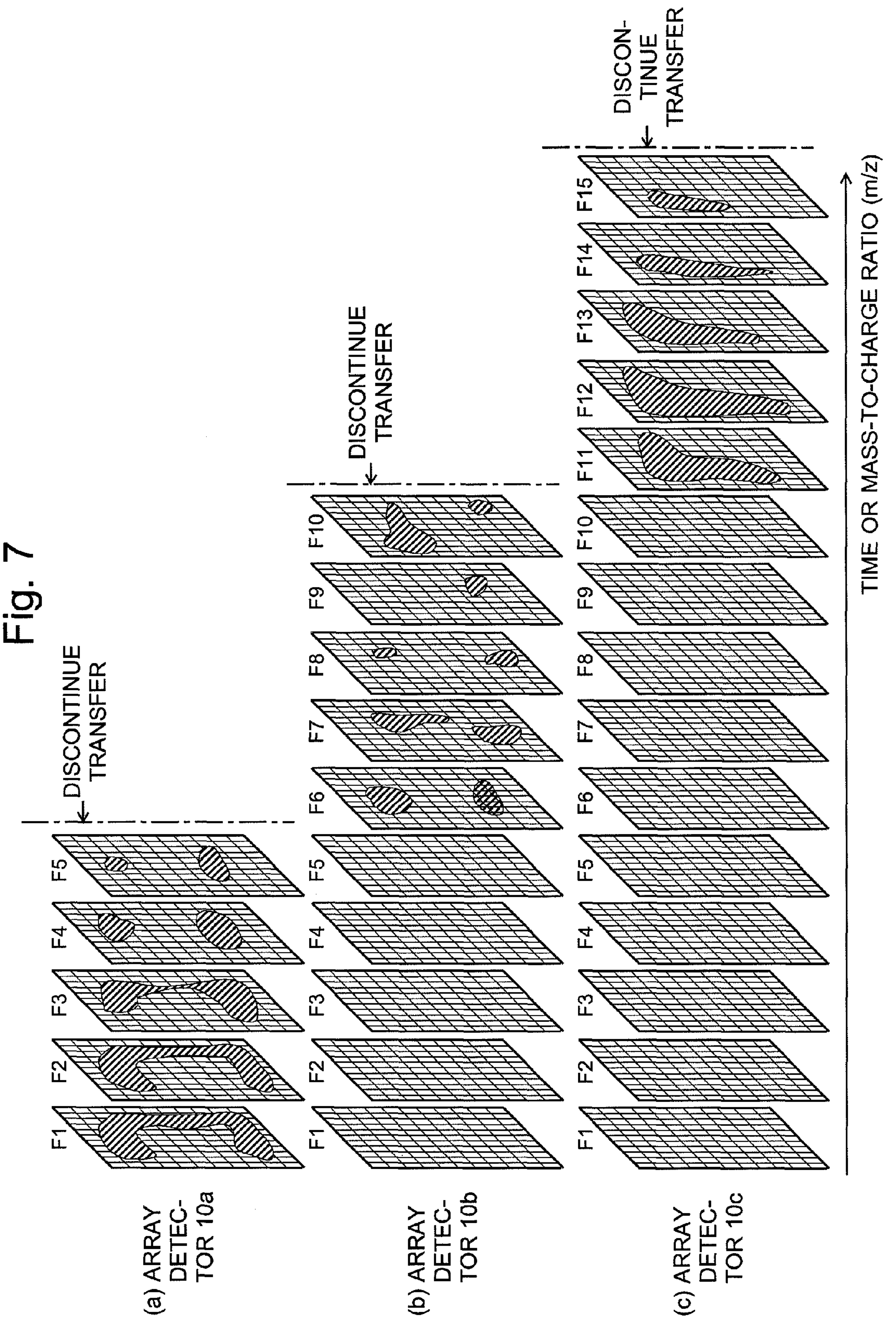
FIG. 7 is a schematic diagram illustrating an operation of the two-dimensional detector section in the mass microscope of the first embodiment.

FIG. 7 is a diagram schematically illustrating a transition of mass analysis images obtained by the two-dimensional array detectors 10*a*, 10*b* and 10*c*. For simplicity, the present description assumes that the number of frames that the two-dimensional array detectors 10*a*, 10*b* and 10*c* can each internally hold is five. As state earlier, in the initial measurement stage, the detection unit 7*a* exclusively receives the ions. Therefore, five frames of mass analysis images are obtained in the two-dimensional array detector 10*a* in this stage, whereas the mass analysis images obtained in the other two-dimensional array detectors 10*b* and 10*c* in this stage are blank images (or noise images).

At the timing where the deflection voltage applied to the deflection electrode 61 is switched from −Va to zero and the deflection voltage applied to the deflection electrode 62 from +Va to zero, the controller 11 discontinues the transfer operation only in the two-dimensional array detector 10*a*. The result is that image signals representing mass analysis images F1 to F5 corresponding to the mass-to-charge ratios M, . . . , M5 are held in the storage CCD lines 25 inside the two-dimensional array detector 10*a*.

After the deflection voltages applied to the deflection electrodes 61 and 62 are both switched to zero, the deflection electric field is no longer present. In this state, the ions passing through the space between the deflection electrodes 61 and 62 experience no force deflecting their flight path, so that they travel straight and reach the central detection unit 7*b*. The mass-to-charge ratios of the ions being detected in this stage are within a range larger than the mass-to-charge ratios M1 to M5 of the ions previously detected by the two-dimensional array detector 10*a*. In this stage, only the two-dimensional array detectors 10*b* and 10*c* are transferring signal charges. Consequently, as shown in FIGS. 7(*b*) and 7(*c*), five frames of mass analysis images F6 to F10 corresponding to the successively increasing mass-to-charge ratios M6, M7, M8, M9 and M10 are obtained in the two-dimensional array detector lob, whereas nothing more than blank images (or noise images) is obtained in the other two-dimensional array detector 10*c*.

At the timing where the deflection voltage applied to the deflection electrode 61 is switched from zero to +Va and the deflection voltage applied to the deflection electrode 62 from zero to −Va, the controller 11 additionally discontinues the transfer operation in the two-dimensional array detector 10*b*. The result is that image signals representing mass analysis images F6 to F10 corresponding to the mass-to-charge ratios M6, . . . , M10 are held in the storage CCD lines 25 inside the two-dimensional array detector 10*b*.

As a result of switching the deflection voltage applied to the deflection electrode 61 to Va and the deflection voltage applied to the deflection electrode 62 to −Va, a positive deflection electric field is created between the deflection electrodes 61 and 62. Due to this field, the ions belonging to a mass-to-charge ratio range larger than the mass-to-charge ratio M10 of the ion previously detected by the two-dimensional array detector 10*b* are made to considerably deflect in the positive direction of the X-axis in FIG. 1. These ions are then directed to the MCP 8*c* of the detection unit 7*c*. Accordingly, while the deflection voltage +Va is applied to the deflection electrode 61 and the deflection voltage −Va to the deflection electrode 62, the detection unit 7*c* practically the only unit that detects the ions; no ion comes to the other detection units 7*a* and 7*b*. In this stage, only the two-dimensional array detector 10*c* is transferring signal charges. Consequently, as shown in FIG. 7(*c*), five frames of mass analysis images F11 to F15 corresponding to the successively increasing mass-to-charge ratios M11, M12, M13, M14 and M15 are obtained in the two-dimensional array detector 10*c*. After the mass analysis image F15 has been obtained, the controller 11 discontinues the transfer operation in the two-dimensional array detector 10*c* at an appropriate timing. The result is that image signals representing mass analysis images F11 to F15 corresponding to the mass-to-charge ratios M11, . . . , M15 are held in the storage CCD lines 25 inside the two-dimensional array detector 10*c*.

After the transfer operation is stopped in all of the two-dimensional array detectors 10*a*, 10*b* and 10*c*, the image signals stored in each of the detectors 10*a*, 10*b* and 10*c* are read out and stored in the data memory 13. The data processor 12 carries out a predetermined process on the data stored in the data memory 13. For example, it may create a grayscale image in which the signal intensity is represented with shading for each mass-to-charge ratio to provide distribution information of a substance corresponding to that mass-to-charge ratio. Alternatively, the difference in the signal intensity may be represented by different display colors rather than the grayscale pattern, or a three-dimensional graph may be created with the signal intensity plotted on an additional axis. Another possible method is the contour representation using lines each of which connects multiple points at which the signal intensity (or concentration) is approximately identical. Any of these or other display methods can be used to present the aforementioned analysis results on the display unit 16.

As described thus far, in the mass microscope of the first embodiment, three detection units 7*a*, 7*b* and 7*c*, each including the two-dimensional array detector 10*a*, 10*b* or 10*c*, are disposed in parallel. The TOF mass separator 4 temporally separates ions according to their mass-to-charge ratio. Their flight path is changed with time by means of a deflection electric field so that the ions will be sequentially directed to each of the three detection units 7*a*, 7*b* and 7*c*. Thus, the present system can acquire mass analysis images over a wider mass-to-charge ratio range (e.g. from M1 to M15) as compared to a conventional system having only a single detection unit and hence a narrow mass-to-charge ratio range (from M1 to M5) for acquiring mass analysis images. The mass resolution of the present system is determined by the time interval of the signal transfer operation. Therefore, it is possible to widen the range of the measurable mass-to-charge ratios while maintaining the mass resolution at the same level. It is also possible to improve the mass resolution by decreasing the time interval if the range of mass-to-charge ratios to be measured is the same as in the conventional case.

Figure 6:
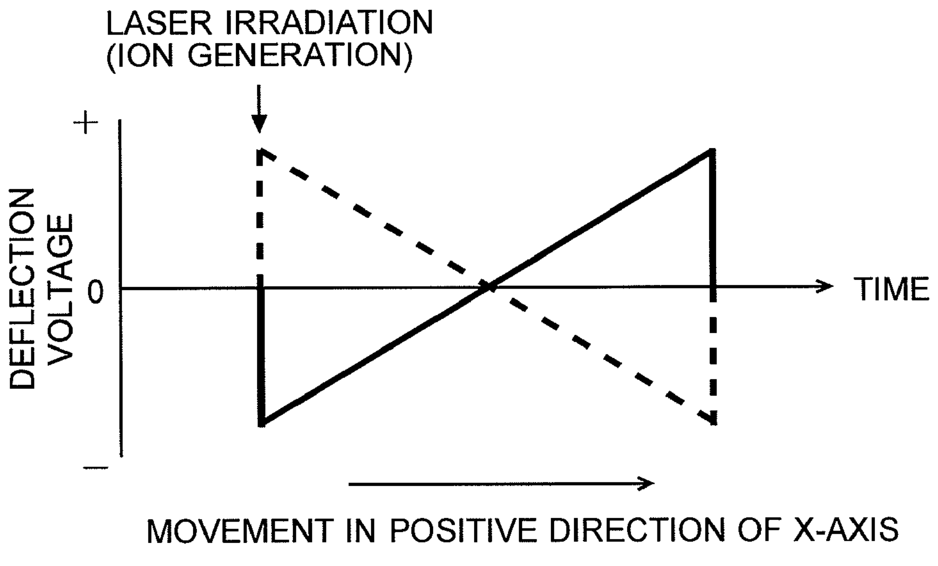
FIG. 6 is a waveform chart showing another example of the voltage applied to the deflection electrodes in the mass microscope of the first embodiment.

The deflection voltage in the previous embodiment was changed in a stepwise manner. It is also possible to sweep the deflection voltage like a slope as shown in FIG. 6. In this case, the ions with smaller mass-to-charge ratios arriving at the deflection electric field in the earliest stage are made to considerably deflect due to the strong negative deflection electric field and reach the detection unit 7*a*. This is the same as in the previous embodiment. The mass-to-charge ratio of the ions arriving at the deflection electric field gradually increases with time, while the negative deflection electric field gradually weakens. As a result, the magnitude of deflection of the flight path gradually decreases and the path becomes closer to the straight path. When the voltage is zero, the ions travel in a straight direction. A further lapse of time creates a new situation where a positive deflection voltage is applied to the deflection electrode 61 and a negative deflection voltage to the deflection electrode 62. The (absolute) values of the two voltages gradually increase, gradually strengthening the positive deflection electric field. Accordingly, the ions are made to deflect in the positive direction of the X-axis, and their magnitude of deflection gradually increase.

With the aforementioned change in the deflection voltage changes, the projection image on the ion-receiving surfaces of the MCPs 8*a*, 8*b* and 8*c* of the two-dimensional detector section 7 gradually shifts in the positive direction of the X-axis. Accordingly, in the present case, the signal transfer operation of each two-dimensional array detector 10*a*, 10*b* and 10*c* can be discontinued at a point in time where the shifting projection image exits the detection unit 7*a* or 7*b*. The shift amount of the projection image per unit time can be previously calculated. By correcting this shift amount in the data-processing stage, it is possible to create a mass analysis image similar to the one obtained in the previous case of changing the deflection voltage in the stepwise manner.

The previous embodiment used a normal type in-situ storage image sensor as the two-dimensional array detector 10*a*, 10*b* or 10*c*. Alternatively, it is possible to use a reverse-side type in-situ storage image sensor. The configuration of the reverse-side type sensor is basically identical to that of the normal type. The major difference is that the former type uses a thinner substrate so that electrons impinging on the reverse side can easily come in the vicinity of the obverse surface. These incident electrons are then captured by each micro detection element, which corresponds to a photodiode. The captured electrons form an electric current, which is used in place of the photoelectric current. Therefore, it is possible to directly send electrons onto the two-dimensional array detector and extract a pixel signal corresponding to the amount of the electrons.

The detection unit can be constructed as shown in FIG. 6(*b*). The MCP 8*a* receives the two-dimensionally distributed ions, converts each ion into electrons and multiplies them. No fluorescent plate is required in the next stage; the multiplied electrons are directly sent to the reverse-side detection surface of the two-dimensional array detector 40*a*. It should naturally be noted that the relative positional relationship of the portions on the sample S at which the ions have been emitted is also maintained on the detection surface of the two-dimensional array detector 40*a*. The present configuration is advantageous to the cost reduction since it requires no fluorescent plate. Another advantage exists in that the elimination of the fluorescent plate makes it possible to set the MCP 8*a* closer to the two-dimensional array detector 40*a*. This is effective in alleviating blurring of the focused image. Thus, the spatial resolution of the mass analysis image can be improved.

Second Embodiment

Figure 8:
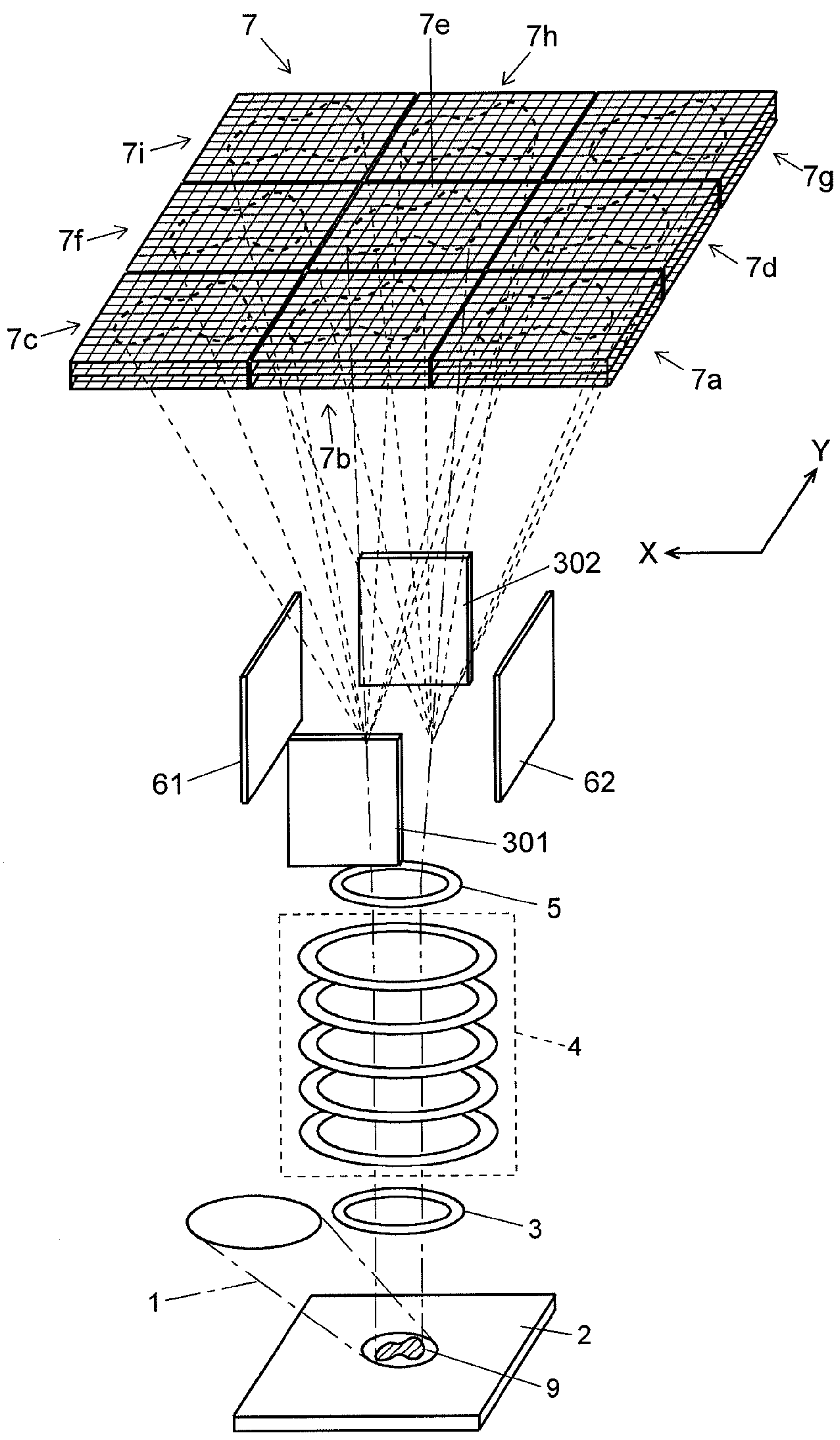
FIG. 8 is a configuration diagram of the essential portions of a mass microscope according to the second embodiment.

Another (second) embodiment of the present invention is hereinafter described with reference to FIG. 8. FIG. 8 is a configuration diagram of the essential portions of the mass microscope in the second embodiment. The components identical to those of the first embodiment are denoted by the same numerals, and explanations of these components are omitted. The blocks representing the configuration of the electrical circuits of the control system or processing system are also omitted to simplify the figure.

The configuration of the second embodiment includes another pair of deflection electrodes 301 and 302 facing each other in the direction perpendicular to the previously mentioned parallel deflection electrodes 61 and 62. The nine detection units 7*a*, 7*b*, 7*c*, 7*d*, 7*e*, 7*f*, 7*g*, 7*h* and 7*i* are arrayed not only along the X-axis but also along the Y-axis. In this configuration, the flight path of the ions is deflected in the X-direction by a deflection electric field created by the deflection electrodes 61 and 62 and also in the Y-direction by another deflection electric field created by the additional deflection electrodes 301 and 302. In this system, the detection unit at which the mass analysis image is acquired is sequentially switched among the detection units 7*a* to 7*i* with the lapse of time, i.e. with an increase in the mass-to-charge ratio of the ions emitted from the TOF mass separator 4. Thus, a wider range of the measurable mass-to-charge ratios than that of the first embodiment is achieved.

Third Embodiment

Figure 9:
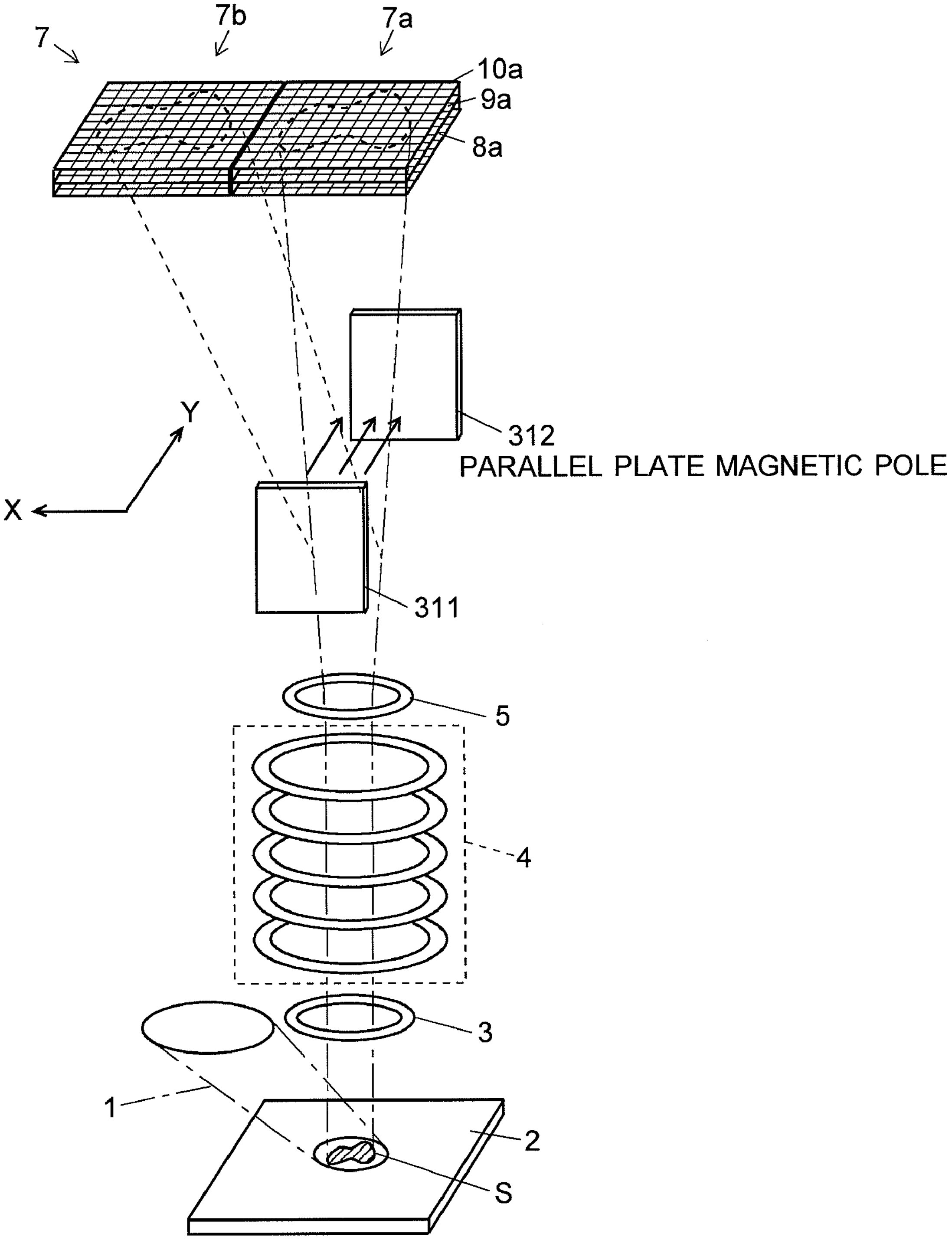
FIG. 9 is a configuration diagram of the essential portions of a mass microscope according to the third embodiment.

Another (third) embodiment of the present invention is described with reference to FIG. 9. FIG. 9 is a configuration diagram of the essential portions of the mass microscope in the third embodiment. The components identical to those of the first embodiment are denoted by the same numerals, and explanations of these components are omitted. The blocks representing the configuration of the electrical circuits of the control system or processing system are also omitted to simplify the figure.

Unlike the first and second embodiments in which an electric field was used to deflect ions, the third embodiment uses a magnetic field to deflect ions. Specifically, a pair of parallel plate magnetic poles 311 and 312 are disposed in place of the deflection electrodes in the space between the projection lens 5 and the two-dimensional detector section 7. A static magnetic field is created between these parallel plate magnetic poles 311 and 312. In general, an ion being accelerated by a voltage E in a uniform magnetic field B revolves with a radius R determined by the following equation:

$$R=(1/B)\cdot\sqrt{(2mE/e)}$$

where m is the mass of the ion, E is the acceleration voltage, and e is the charge amount of the ion. Since the radius of revolution changes depending on the mass of the ion, each ion that has left the magnetic field follows a different path determined by the mass of the ion. The magnitude of deflection of the path is larger as the radius R is smaller. This means that an ion with a smaller mass-to-charge ratio will be deflected with a greater magnitude in the positive direction of the X-axis in FIG. 9. Therefore, among the ions that have been emitted from a two-dimensional area on the sample S due to an irradiation with the laser light 1, an ion with the smallest mass-to-charge ratio will reach the leftmost end of a predetermined range of the detection unit 7*b*, after which the arrival point of the ions relatively shifts in the negative direction of the X axis as their mass-to-charge ratio increases. The relationship between the shift amount and the mass-to-charge ratio (or time) can also be determined beforehand in the present case. Therefore, it is possible to create a mass analysis image in which the shift amount is corrected.

Figure 10:
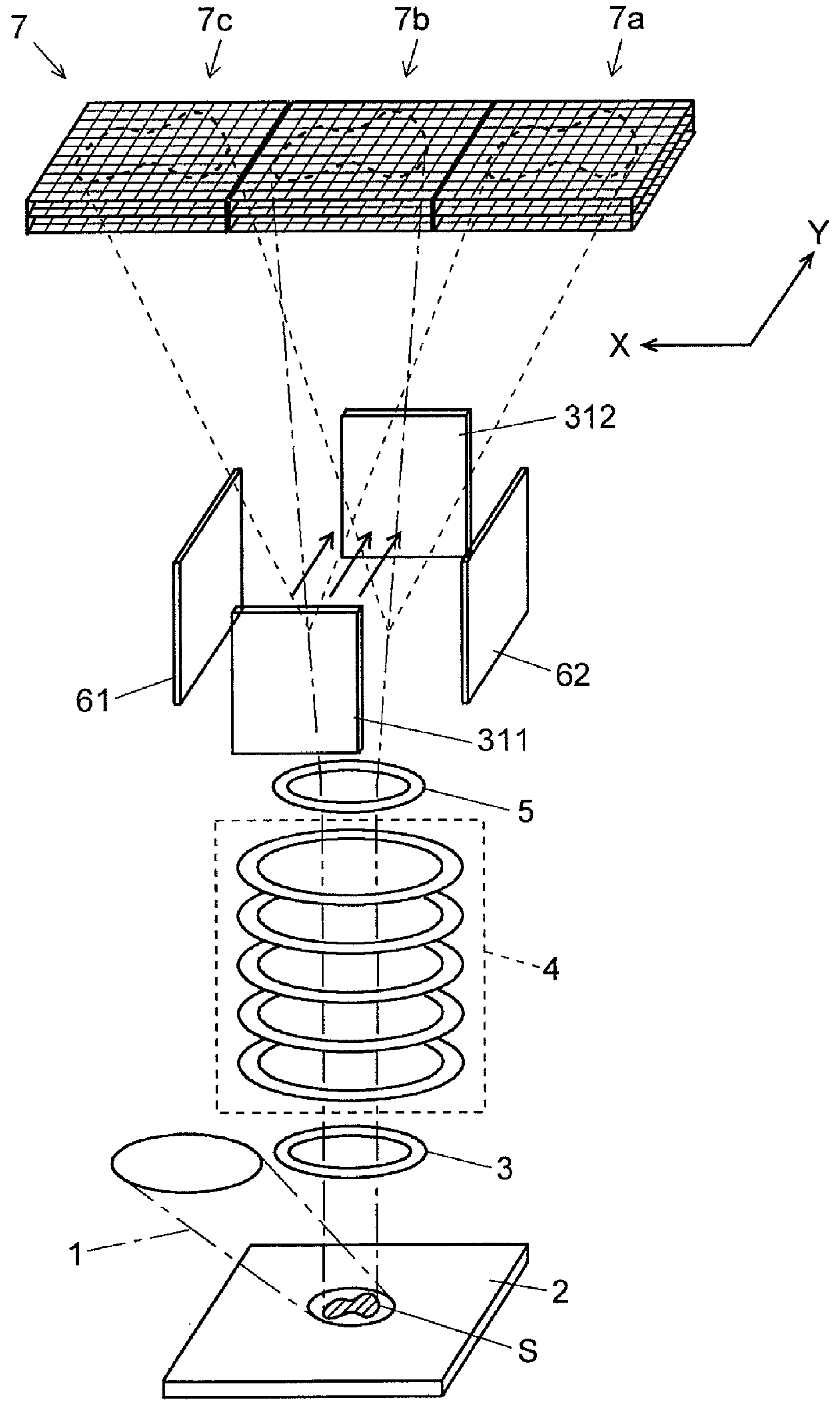
FIG. 10 is a configuration diagram of the essential portions of a mass microscope according to the fourth embodiment.

Still another (fourth) embodiment of the present invention is described with reference to FIG. 10. FIG. 10 is a configuration diagram of the essential portions of the mass microscope in the fourth embodiment. The components identical to those of the first embodiment are denoted by the same numerals, and explanations of these components are omitted. The blocks representing the configuration of the electrical circuits of the control system or processing system are also omitted to simplify the figure.

In this example, an electric field created by a pair of deflection electrodes 61 and 62 facing each other is combined with a magnetic field created by a pair of parallel plate magnetic poles 311 and 312 facing each other. A mass separator using a combination of electric and magnetic fields is generally known as the E×B mass separator. In this mass separator, the force due to the magnetic field works in opposition to the force due to the electric field. For an ion with a specific mass-to-charge ratio $m_0$, the two forces balance each other, allowing the ion to travel straight. Ions with smaller mass-to-charge ratios are affected more strongly by the magnetic field, so that their path is deflected in the positive direction of the X-axis in FIG. 10. Ions with larger mass-to-charge ratios are less affected by the magnetic field and hence more strongly by the electric field, so that their path is deflected in the negative direction of the X-axis in FIG. 10. Thus, the arrival point of the ions shifts with an increase in the mass-to-charge ratio. Accordingly, as in the previous embodiments, it is possible to sequentially use each two-dimensional array detector 10*a*, 10*b* or 10*c* to acquire mass analysis images within a different mass-to-charge ratio range and thereby widen the measurable mass-to-charge ratio range.

Fifth Embodiment

Figure 11:
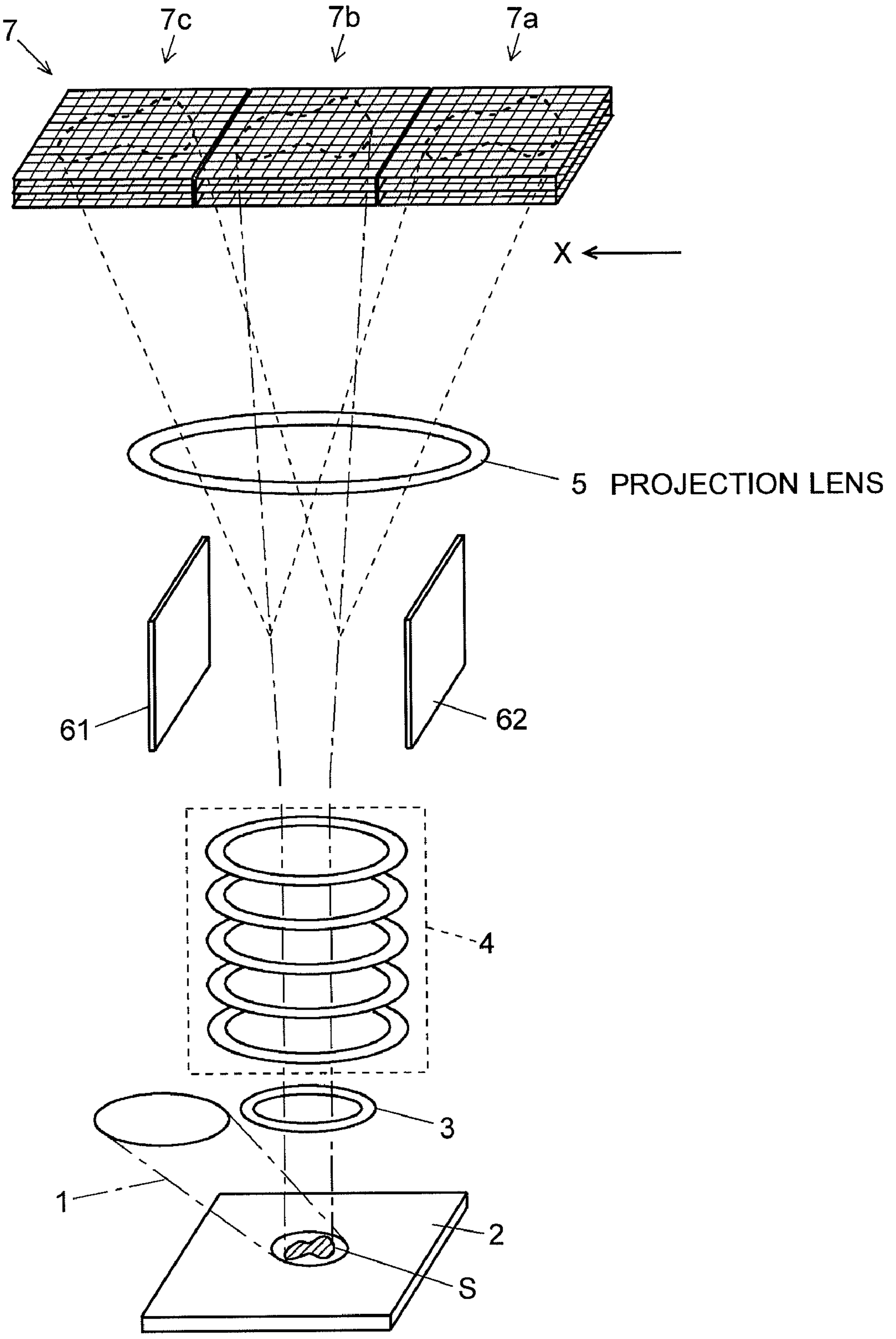
FIG. 11 is a configuration diagram of the essential portions of a mass microscope according to the fifth embodiment.

Still another (fifth) embodiment of the present invention is described with reference to FIG. 11. FIG. 11 is a configuration diagram of the essential portions of the mass microscope in the fifth embodiment. The components identical to those of the first embodiment are denoted by the same numerals, and explanations of these components are omitted. The blocks representing the configuration of the electrical circuits of the control system or processing system are also omitted to simplify the figure.

In any of the previous four embodiments, the projection lens 5 was located immediately behind the ion emission port of the TOF mass separator 4, with the deflection electric field or deflection magnetic field created between the projection lens 5 and the two-dimensional detector section 7. Alternatively, it is possible to dispose the projection lens 5 between the deflection electric (or magnetic) field and the two-dimensional detector section 7 as in the present embodiment. This configuration is also capable of shifting the arrival point of the ions and projecting the images according to the mass-to-charge ratio of the ions.

It should be noted that any of the previous embodiments is a mere example. It is clear that any changes, modifications or additions appropriately made within the spirit of the present invention will be covered by the claims of this patent application.

The invention claimed is:

1. A mass spectrometer, comprising:

a) an ionizer for simultaneously ionizing components present within a predetermined two-dimensional area on a sample;

b) a mass separator for separating ions, generated by the ionizer, in such a manner that the ions will be emitted at different points in time according to their mass-to-charge ratio while maintaining a two-dimensional relative positional relationship with which the ions have been generated;

c) a two-dimensional detector including multiple pairs of converters and two-dimensional array detectors, each converter receiving the ions separated by the mass separator and converting each ion into a photon or electron whose amount corresponds to that of the ion, while maintaining the two-dimensional relative positional relationship with which the ions have been generated, each two-dimensional array detector consisting of an in-situ storage image sensor having a detector section and a memory section, the detector section including two-dimensionally arrayed micro detection elements each detecting the photon or electron produced by the converter and outputting a corresponding electric signal, the memory section being capable of individually holding electric signals produced by each micro detection element for a predetermined number of frames, the multiple pairs of converters and two-dimensional array detectors being arranged in parallel along an extending direction of the detector section; and d) an ion deflector located in a space between an ion emission port of the mass separator and the converters, for creating an electric field and/or magnetic field producing a force for deflecting a flight path of an ion passing through the space, wherein a magnitude of deflecting the flight path with the ion deflector is changed so that an ion passing through the ion deflector at a different point in time will be detected by a different pair of the converter and the two-dimensional array detector in the two-dimensional detector.

2. The mass spectrometer according to claim 1, wherein the mass separator is a time-of-flight mass analyzer.

3. The mass spectrometer according to claim 1, further comprising a controller for controlling an operation of storing electric signals in the memory section in each two-dimensional array detector, wherein the controller controls each of the multiple two-dimensional array detectors so that the aforementioned operation will be synchronized with a timing at which an ion reaches the converter for the two-dimensional array detector concerned.

4. The mass spectrometer according to claim 1, wherein the ion deflector includes one or more pairs of deflection electrodes facing one another across the space which the ions pass through and a voltage applier for applying a voltage to the deflection electrodes, and the voltage can be changed so as to change the magnitude of deflection of the flight path of the ions.

5. The mass spectrometer according to claim 1, wherein:

the ion deflector includes a pair of magnetic poles for generating a magnetic field, the magnetic poles facing each other across a space which the ions pass through; and the magnitude of deflection of the flight path changes with a change in the mass-to-charge ratio of ions passing through the magnetic field.

6. The mass spectrometer according to claim 1, wherein the two-dimensional array detector is an in-situ storage image sensor having the detector section formed by the two-dimensionally arrayed micro detection elements performing photoelectric conversion.

7. The mass spectrometer according to claim 1, wherein the two-dimensional array detector is a reverse-side type in-situ storage image sensor in which each micro detection element captures and detects an electron impinging on a detection surface located on a side opposite to a side where the detector section is formed.

* * * * *